(12) United States Patent
Ooshima (10) Patent No.: US 10,777,511 B2
(45) Date of Patent: Sep. 15, 2020

(54) SEMICONDUCTOR DEVICE AND MANUFACTURING METHOD THEREOF

(71) Applicant: TOSHIBA MEMORY CORPORATION, Minato-ku, Tokyo (JP)

(72) Inventor: Kazuhiro Ooshima, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/119,945

(22) Filed: Aug. 31, 2018

(65) Prior Publication Data

US 2019/0287925 A1    Sep. 19, 2019

(30) Foreign Application Priority Data

Mar. 19, 2018 (JP) .................. 2018-050578

(51) Int. Cl.
| | | |
|---|---|---|
| H01L 23/48 | (2006.01) | |
| H01L 23/52 | (2006.01) | |
| H01L 29/40 | (2006.01) | |
| H01L 23/00 | (2006.01) | |
| H01L 23/522 | (2006.01) | |
| H01L 23/528 | (2006.01) | |
| H01L 23/532 | (2006.01) | |
| H01L 21/768 | (2006.01) | |

(52) U.S. Cl.
CPC ...... *H01L 23/562* (2013.01); *H01L 21/76802* (2013.01); *H01L 21/76831* (2013.01); *H01L 21/76877* (2013.01); *H01L 23/528* (2013.01); *H01L 23/5226* (2013.01); *H01L 23/5329* (2013.01); *H01L 23/53257* (2013.01); *H01L 2221/1063* (2013.01)

(58) Field of Classification Search
CPC ............. H01L 23/528; H01L 23/53295; H01L 21/02502; H01L 21/76832; H01L 21/76802
USPC ......................... 257/750, 752, 758
See application file for complete search history.

(56) References Cited

U.S. PATENT DOCUMENTS

| | | | |
|---|---|---|---|
| 8,643,084 B2 * | 2/2014 | Shin ................. | H01L 27/11578 257/317 |
| 8,766,350 B2 | 7/2014 | Arisumi et al. | |
| 2005/0062165 A1 * | 3/2005 | Saenger ............ | H01L 21/76807 257/774 |

(Continued)

FOREIGN PATENT DOCUMENTS

| | | |
|---|---|---|
| JP | 2014-187332 A | 10/2014 |
| JP | 5668006 B2 | 2/2015 |
| JP | 2016-201407 A | 12/2016 |

*Primary Examiner* — S. V. Clark
(74) *Attorney, Agent, or Firm* — Foley & Lardner LLP (57) ABSTRACT

A semiconductor device includes a semiconductor substrate, at least two first films, a bridge portion, and a conductive member. The two first films are spaced apart from each other, along a first direction which is an in-plane direction of the semiconductor substrate, and along a second direction which is in the in-plane direction of the semiconductor substrate and is perpendicular to the first direction. The bridge portion connects portions of side facing surfaces of the two first films to each other, and has a flat bottom surface. The conductive member is provided under the bottom surface of the bridge portion.

8 Claims, 12 Drawing Sheets

(56) References Cited

U.S. PATENT DOCUMENTS

| | | | |
|---|---|---|---|
| 2005/0184397 A1* | 8/2005 | Gates | H01L 21/76801 |
| | | | 257/774 |
| 2014/0284687 A1 | 9/2014 | Murakami | |
| 2016/0181275 A1 | 6/2016 | Choi et al. | |
| 2016/0300845 A1 | 10/2016 | Ishizaki et al. | |

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2018-050578, filed Mar. 19, 2018, the entire contents of which are incorporated herein by reference.

FIELD

Embodiments described herein relate generally to a semiconductor device and a manufacturing method thereof.

BACKGROUND

In a manufacturing process of a semiconductor device, for example, elongated films may be formed by dividing a film provided on a substrate by a groove. In this case, when the divided film is thick, warpage of the substrate tends to occur. Therefore, there has been proposed a technique of connecting films to each other by a bridge portion.

DESCRIPTION OF THE DRAWINGS

FIGS. 8A and 88 are sectional views illustrating a process of etching the sacrificial films.

FIGS. 9A and 98 are sectional views illustrating a process of forming a bridge portion.

FIGS. 10A and 108 are sectional views illustrating a process of polishing the bridge portion.

FIGS. 11A and 118 are sectional views illustrating a process of etching the second sacrificial film.

FIGS. 12A and 128 are sectional views illustrating a process of etching the first sacrificial film and an insulating layer.

FIGS. 13A and 138 are sectional views illustrating a process of replacing the insulating layer with a conductive layer.

DETAILED DESCRIPTION

In the afore-described structures, a bridge portion may be provided, as mentioned above. Coverage of the bridge portion may affect subsequent processing. Embodiments disclosed herein provide a semiconductor device and a manufacturing method thereof in which the coverage of a bridge portion can be improved while the warpage of a substrate can be reduced.

In general, according to some embodiments, a semiconductor device includes a semiconductor substrate, at least two first films, a bridge portion, and a conductive member. The two first films are spaced apart from each other, along a first direction which is an in-plane direction of the semiconductor substrate, and along a second direction which is in the in-plane direction of the semiconductor substrate and is perpendicular to the first direction. The bridge portion connects portions of opposed side surfaces of the two first films to each other, and has a planar, flat bottom surface. The conductive member is provided under the bottom surface of the bridge portion.

Hereinafter, certain embodiments will be described with reference to drawings. The embodiments do not limit the present disclosure.

Figure 1:
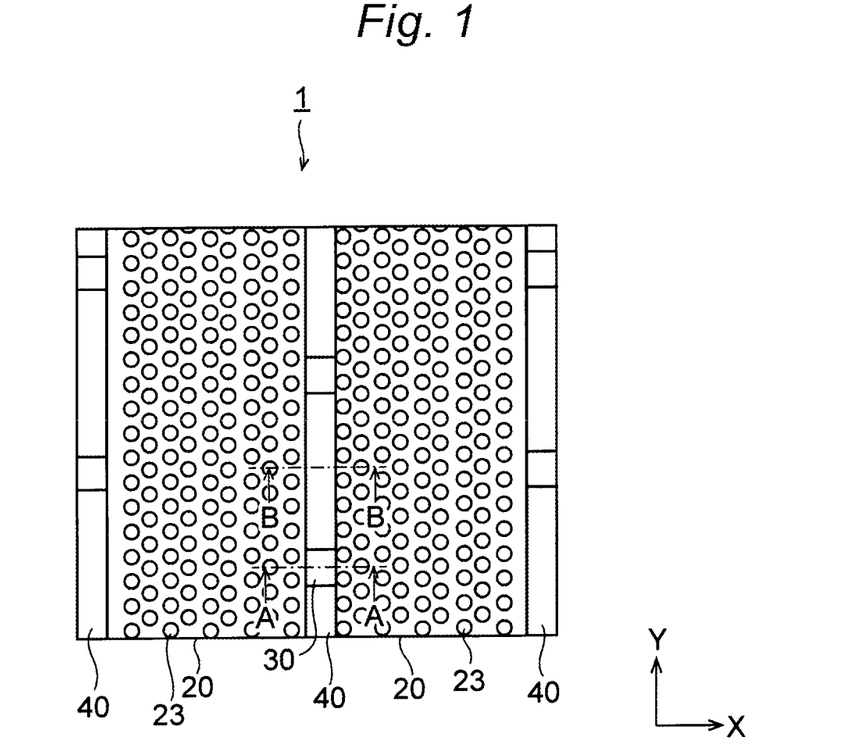
FIG. 1 is a plan view of a semiconductor device according to some embodiments.
Figure 2A:
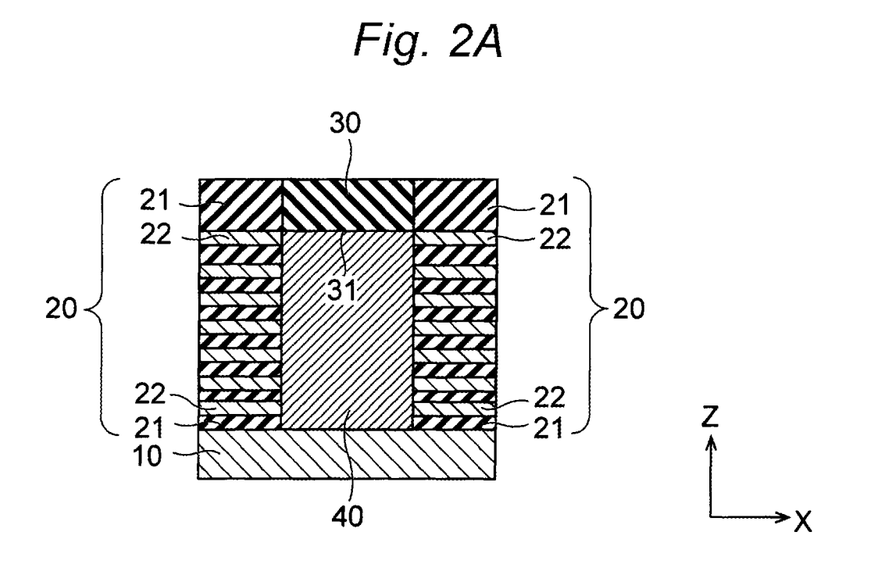
FIGS. 2A and 2B are sectional views taken along a section line A-A and a section line B-B, respectively.
Figure 2B:
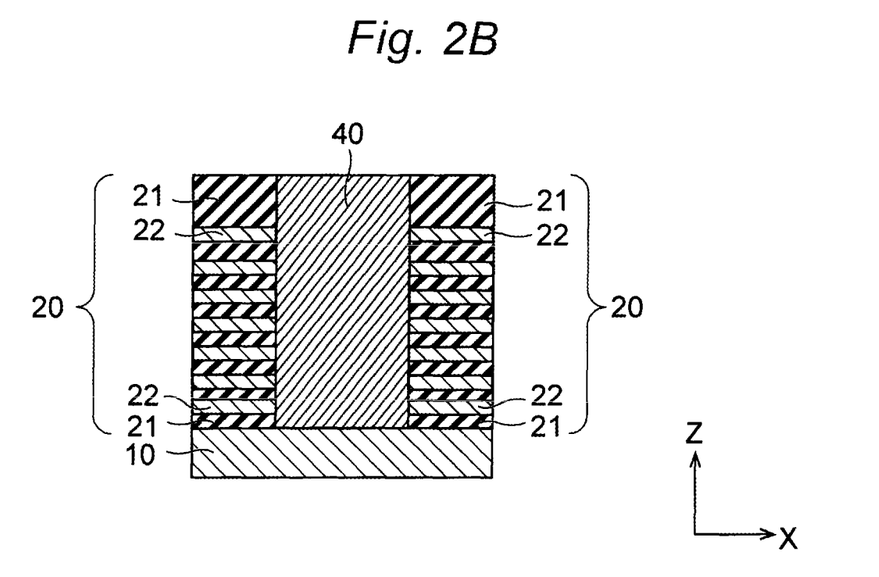

FIG. 1 is a plan view of a semiconductor device according to an exemplary embodiment. FIG. 2A is a sectional view taken along a section line A-A illustrated in FIG. 1. FIG. 2B is a sectional view taken along a section line B-B illustrated in FIG. 1. The semiconductor device 1 according to the exemplary embodiment is a semiconductor storage device having a three-dimensional structure in which memory cells are stacked.

As illustrated in FIG. 1, FIG. 2A, and FIG. 2B, the semiconductor device 1 includes a substrate 10, a plurality of stacked films 20, a bridge portion 30, and a conductive member (a conductor) 40. The substrate 10 is a semiconductor substrate containing silicon or the like.

The plurality of stacked films 20 are spaced apart from each other, as illustrated in FIG. 1, along the X direction (the first direction) which is the in-plane direction of the substrate 10, and along the Y direction (the second direction) which is in the in-plane direction of the substrate 10 and perpendicular to the X direction. Each stacked film 20 includes insulating layers 21 and conductive layers 22. The insulating layers 21 and the conductive layers 22 are alternately stacked in the Z direction perpendicular to the X direction. The insulating layers 21 are silicon oxide ($SiO_2$) layers. The conductive layers 22 are metal layers containing, for example, tungsten (W).

A plurality of memory holes 23 are formed in the stacked films 20 (see FIG. 1). The memory holes 23 pass through the stacked films 20. A memory cell (not illustrated) is formed within each memory hole 23 to be electrically connected to the conductive layers 22. The stacked films 20 may be referred to as a first film. An insulating film or a conductive film may be formed between the substrate 10 and the stacked films 20.

The bridge portion 30 connects portions of side surfaces of the stacked films 20, which are opposed to each other in the X direction, to each other. The bridge portion 30 may reduce the warpage of the substrate 10. The bridge portion 30 has a flat bottom surface 31. In some embodiments, the bottom surface 31 is located on the uppermost conductive layer 22.

The conductive member 40 is filled in a space present between the stacked films 20. The conductive member 40 is, for example, made of the same material as the conductive layer 22.

Hereinafter, a method of manufacturing the semiconductor device 1 according to some embodiments will be described. FIGS. 3 to 6 are sectional views corresponding to FIG. 2A. FIGS. 7A, 8A, 9A, 10A, 11A, 12A, and 13A are sectional views corresponding to FIG. 2A, and FIGS. 7B, 8B, 9B, 10B, 11B, 12B, and 13B are sectional views corresponding to FIG. 2B.

Figure 3:
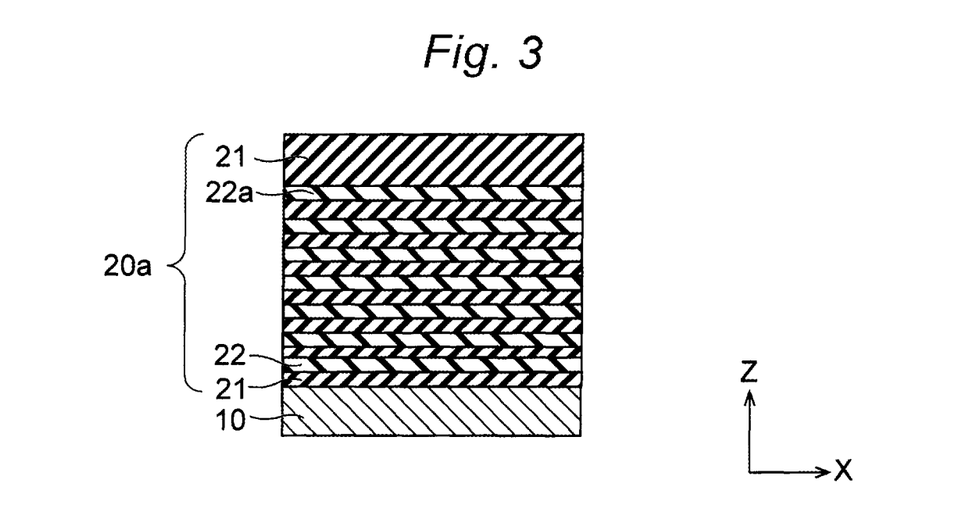
FIG. 3 is a sectional view illustrating a process of forming stacked films.

First, as illustrated in FIG. 3, stacked films 20a are formed by alternately stacking the insulating layers 21 and an insulating layer 22a on the substrate 10. The insulating layer 22a is formed as, for example, a silicon nitride (SiN) layer. The stacked films 20a, the insulating layer 21, and the insulating layer 22a may be referred to as processing target films, a first insulating layer, and a second insulating layer, respectively.

Figure 4:
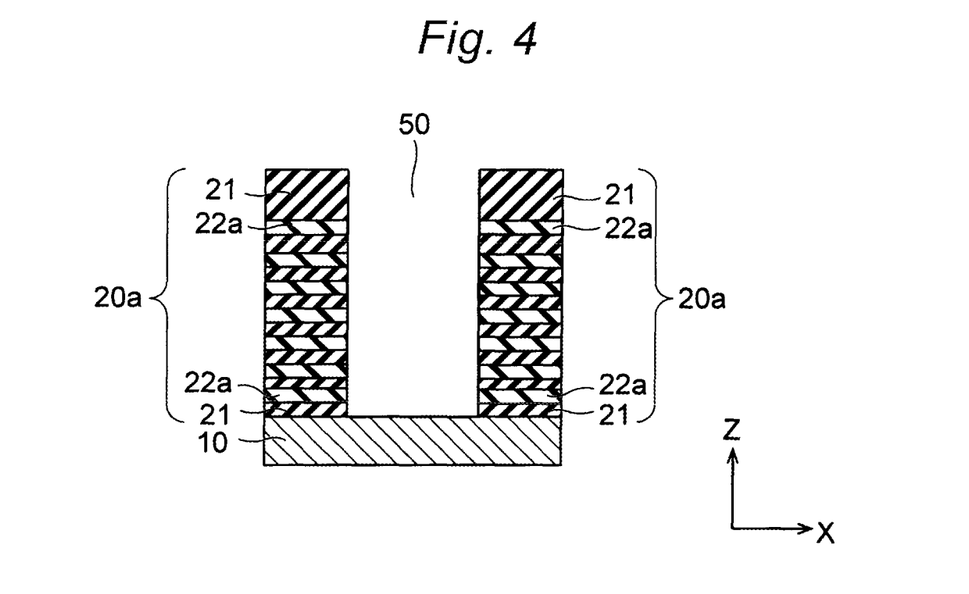
FIG. 4 is a sectional view illustrating a process of forming a groove.

Next, as illustrated in FIG. 4, a groove 50 is formed to divide the stacked films 20a. The groove 50 is formed using, for example, a lithography technique and reactive ion etching (RIE).

Figure 5:
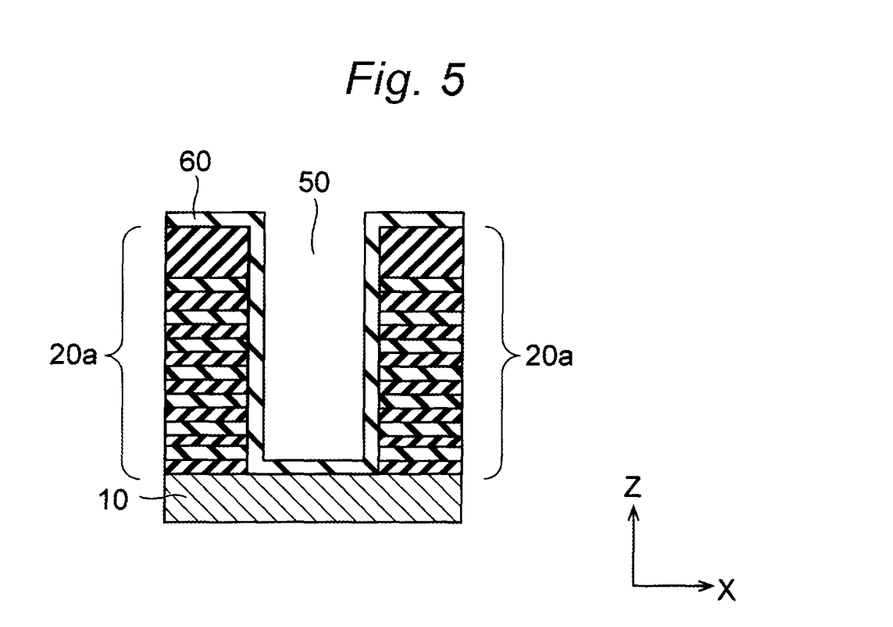
FIG. 5 is a sectional view illustrating a process of forming a first sacrificial film.

Next, as illustrated in FIG. 5, a first sacrificial film 60 is formed on the surfaces of the stacked films 20a and the bottom surface of the groove 50. The first sacrificial film 60 is made of, for example, the same material as the insulating layer 22a, such as silicon nitride.

Figure 6:
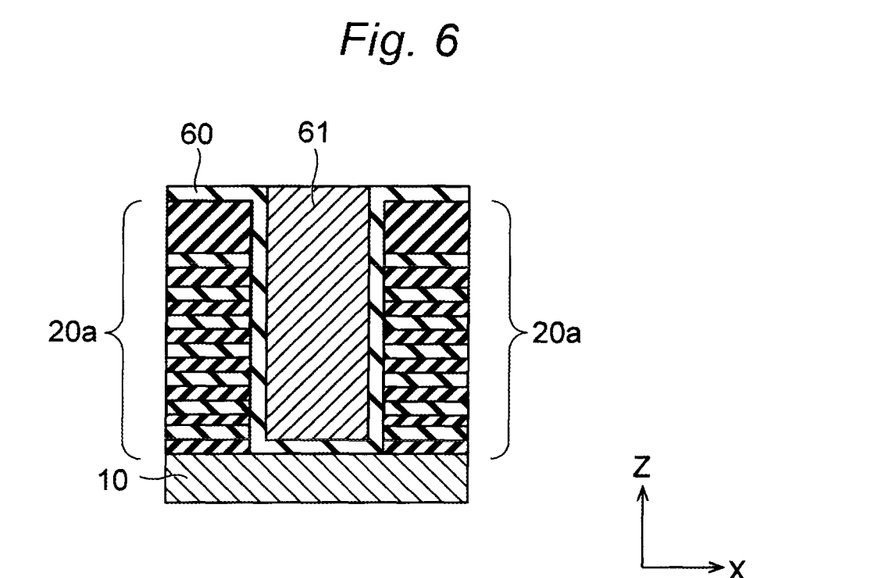
FIG. 6 is a sectional view illustrating a process of forming a second sacrificial film.

Next, as illustrated in FIG. 6, a second sacrificial film 61 is filled in the groove 50. The second sacrificial film 61 is formed as, for example, a polysilicon film.

Figure 7A:
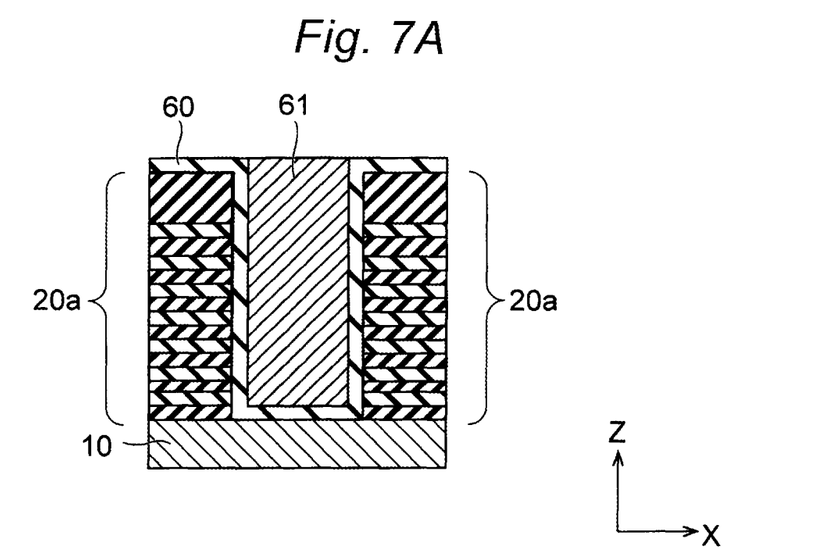
FIGS. 7A and 7B are sectional views illustrating a process of forming a resist film.
Figure 7B:
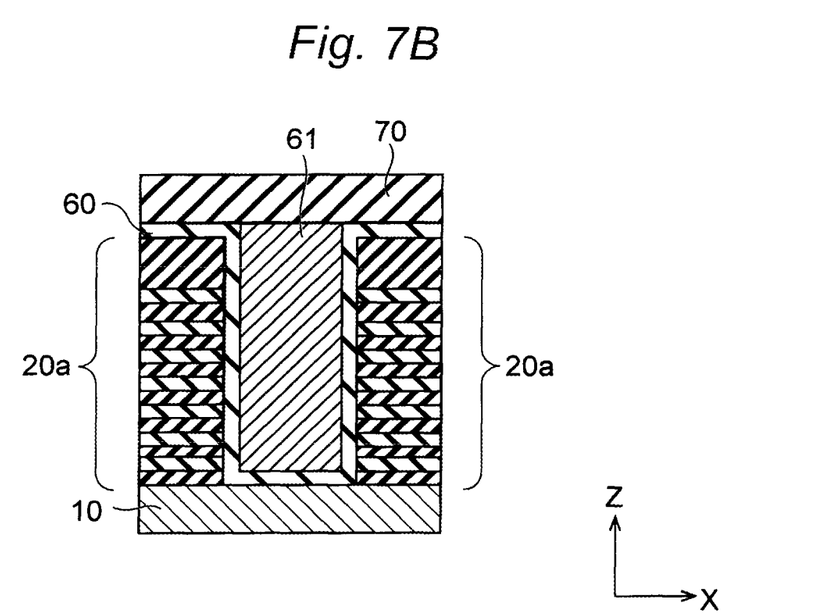

As illustrated in FIGS. 7A and 7B, a resist film 70 (as may also be referred to as a mask) is formed. The resist film 70 is formed as, for example, an organic film. The resist film 70 is, as illustrated in FIG. 7A, patterned so that the first sacrificial film 60 and the second sacrificial film 61 are exposed at a location where the bridge portion 30 is formed.

Figure 8A:
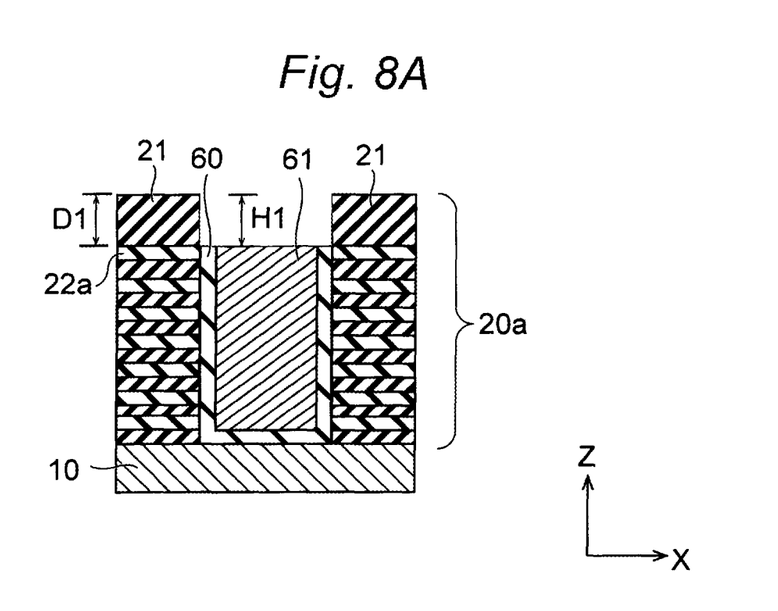
Figure 8B:
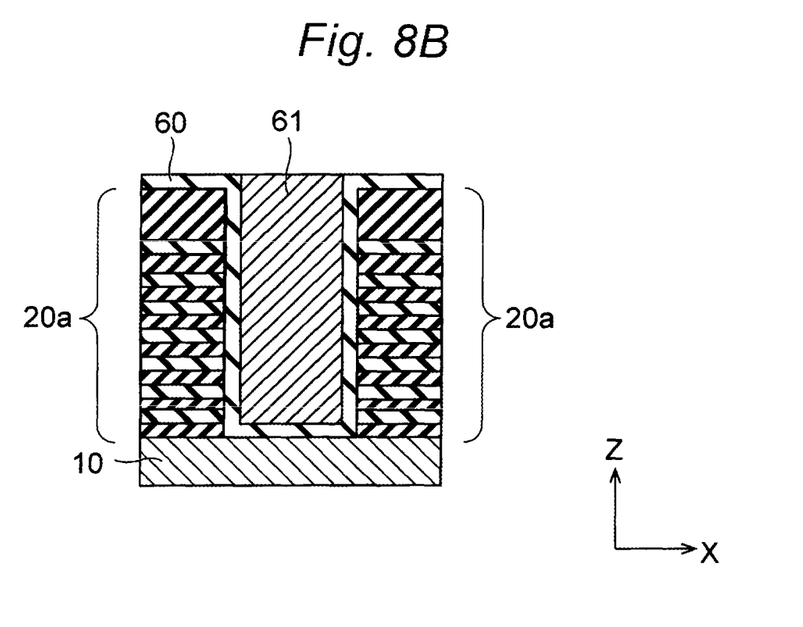

Next, as illustrated in FIGS. 8A and 8B, the first sacrificial film 60 and the second sacrificial film 61 are etched using the resist film 70 as a mask. In this process, the etching depth Hi may be equal to or less than, for example, a distance D1 from the uppermost surface of the stacked films 20a to the top surface of the uppermost insulating layer 22a.

Figure 9A:
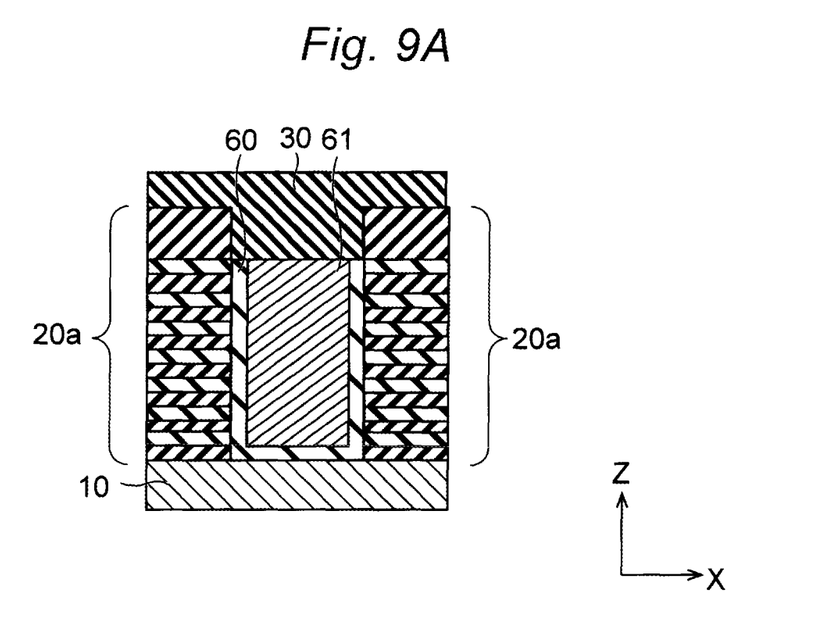
Figure 9B:
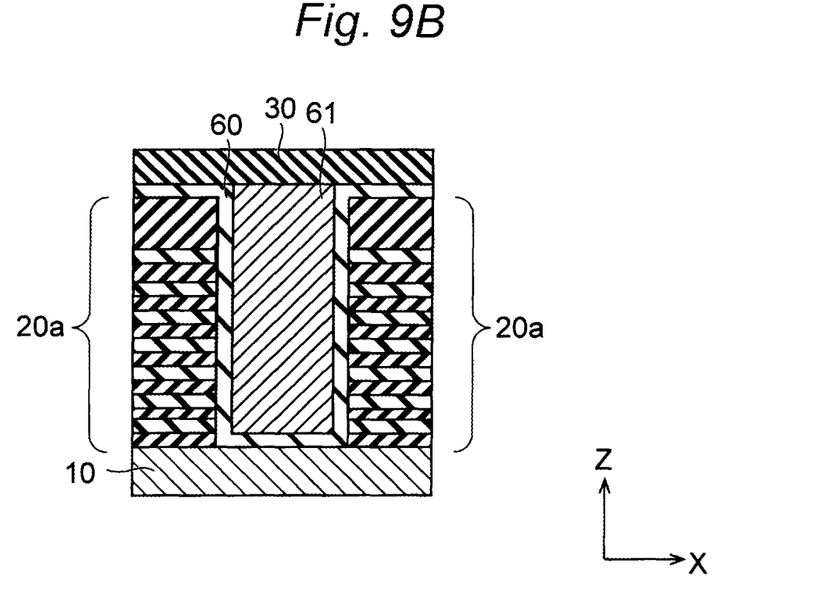

Next, as illustrated in FIG. 9A, the bridge portion 30 is buried in a location where the first sacrificial film 60 and the second sacrificial film 61 are etched. Here, as illustrated in FIG. 9E, the bridge portion 30 is also formed on the top surfaces of the stacked films 20a. The bridge portion 30 is formed as, for example, a silicon monoxide (SiO) or silicon oxide ($SiO_2$) film. As a result, the stacked films 20a are connected to each other by the bridge portion 30.

Figure 10A:
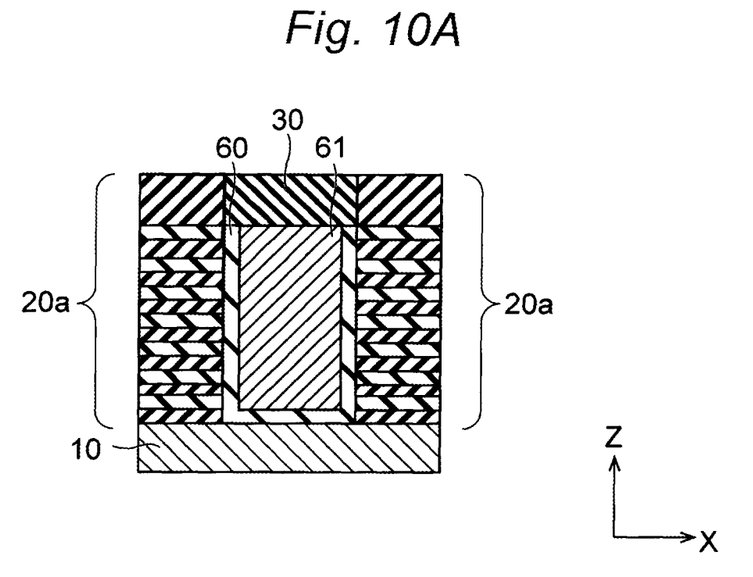
Figure 10B:
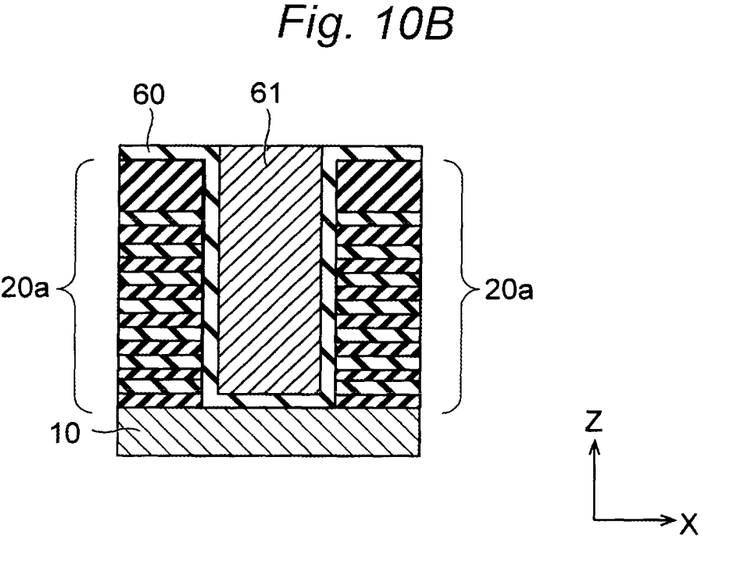

Next, as illustrated in FIGS. 10A and 10B, for example, the bridge portion 30 is flattened by chemical mechanical polishing (CMP) Accordingly, the bridge portion 30 formed on the top surfaces of the stacked films 20a is removed.

Figure 11A:
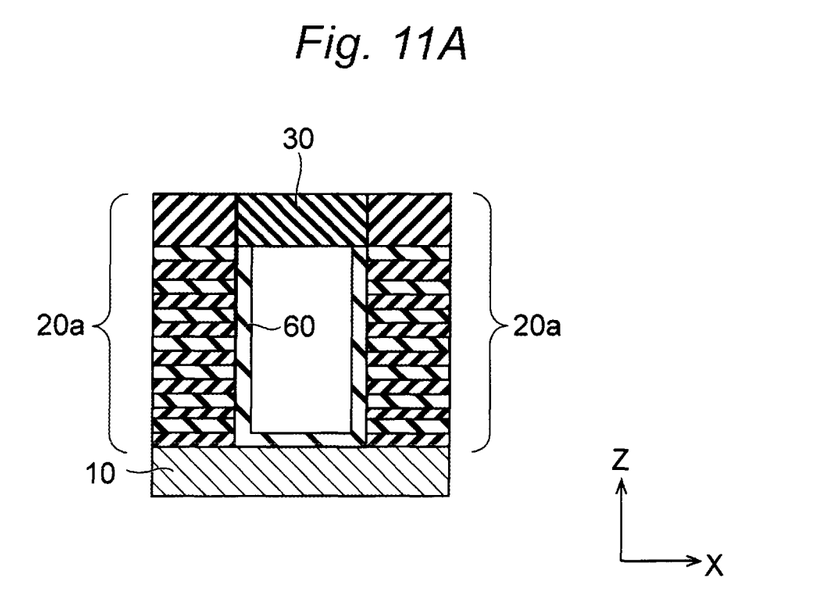
Figure 11B:
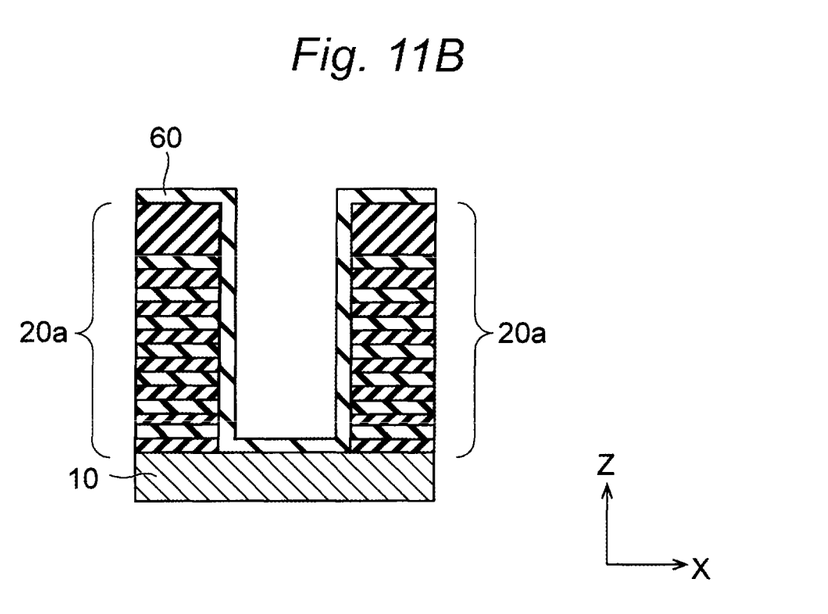

Next, as illustrated in FIGS. 11A and 11B, the second sacrificial film 61 is selectively etched. Here, for example, phosphoric acid at a high temperature is used as an etching solution. Here, the second sacrificial film 61 is removed by isotropic etching, and thus, the bottom surface 31 of the bridge portion 30 is flattened.

Figure 12A:
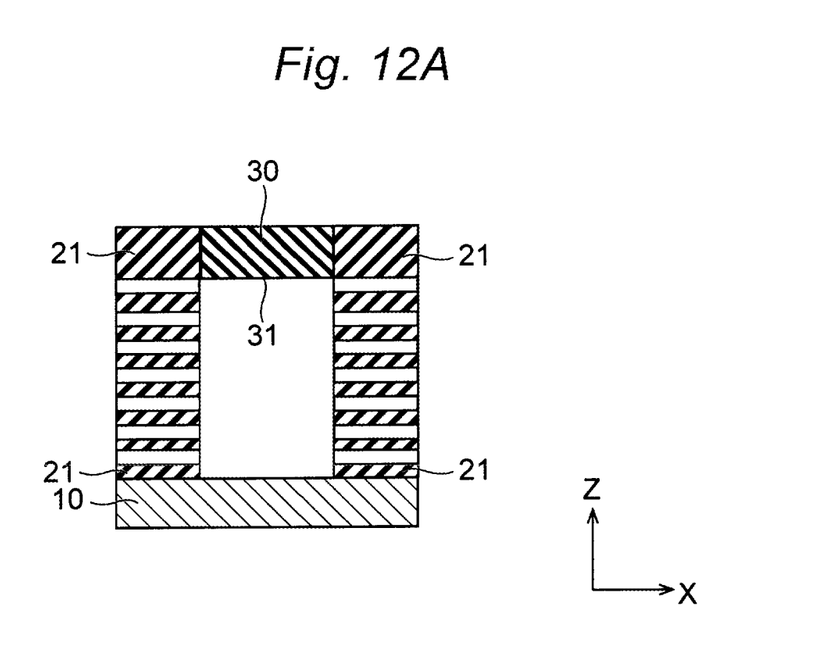
Figure 12B:
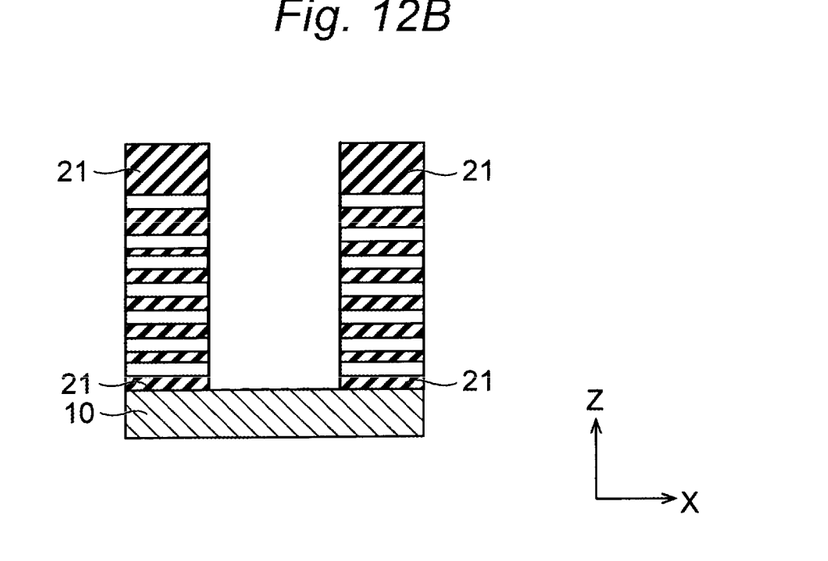

Next, as illustrated in FIGS. 12A and 12B, the first sacrificial film 60 and the insulating layers 22a are simultaneously removed. The first sacrificial film 60 and the insulating layers 22a are made of the same material, and thus may be simultaneously removed.

Figure 13A:
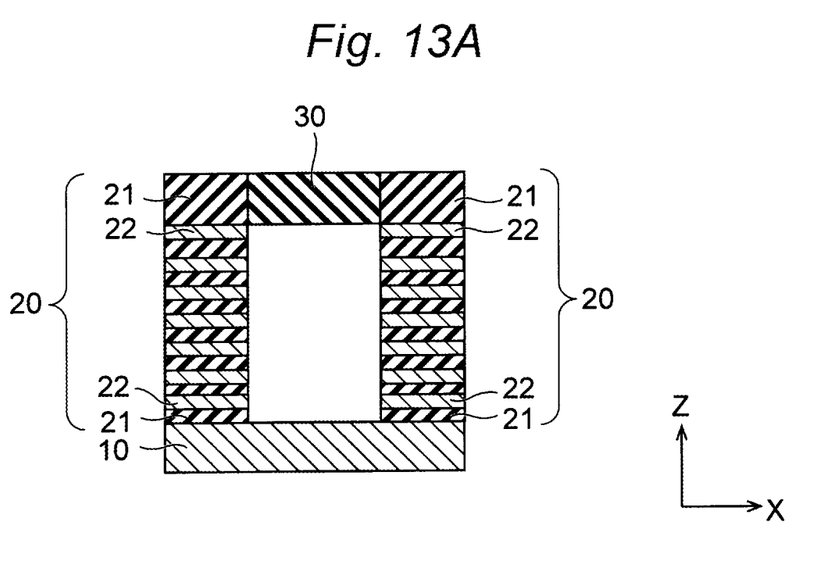
Figure 13B:
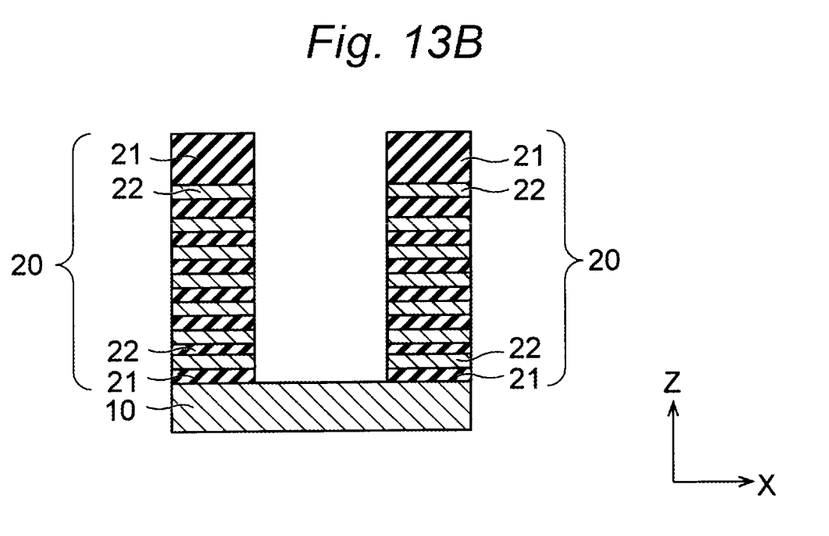

Next, as illustrated in FIGS. 13A and 13B, the insulating layers 22a is replaced with the conductive layers 22. Accordingly, the stacked films 20 are completed. Finally, referring back to FIGS. 2A and 2B, the conductive member 40 is buried.

Figure 14:
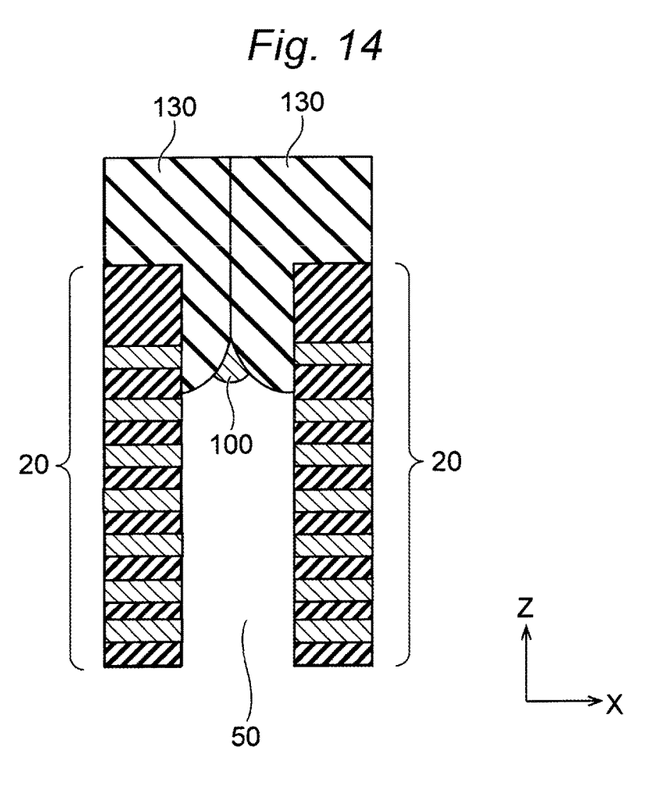
FIG. 14 is a sectional view illustrating the structure of a bridge portion according to a comparative example.

FIG. 14 is a view illustrating the structure of a bridge portion according to a comparative example. The film of a bridge portion 130 illustrated in FIG. 14 is formed by growing or being deposited from opposed side surfaces of the groove 50. Thus, as illustrated in FIG. 14, the bottom surface of the bridge portion 130 is likely to have an uneven shape with a small contact angle. Therefore, for example, in a process after the bridge portion 130 is formed, foreign matter 100 is likely to adhere to the uneven-shaped portion.

Meanwhile, in some embodiments, the first sacrificial film 60 and the second sacrificial film 61 are formed under the bridge portion 30 in advance, and the respective sacrificial films are removed after the bridge portion 30 is formed. Therefore, the bottom surface 31 of the bridge portion 30 is flattened, and thus the adherence of the foreign matter 100 is avoided or lessened. In this manner, the coverage of the bridge portion 30 may be improved, so that the space under the bridge portion 30 may be utilized as a wiring composed of the conductive member 40. With respect to the flatness of the bottom surface 31, after the insulating layers 22a are replaced with the conductive layers 22, an unevenness which is less than a minimum contact angle of a solution for etching back a film forming material may be tolerated.

In some embodiments, the etching amounts of the first sacrificial film 60 and the second sacrificial film 61 may be adjusted to control the depth of the bridge portion 30. Thus, according to the structure of the stacked films 20, the location of the bottom surface 31 of the bridge portion 30 may be freely controlled. For example, when the bottom surface 31 is located on the uppermost insulating layer 22a as in some embodiments, it is possible to prevent the bridge portion 30 from interfering with the replacement of the insulating layers 22a by the conductive layers 22.

In some embodiments, a film connected by the bridge portion 30 may be the stacked films 20, but may be a single layer film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   at least two first films spaced apart from each other along a first direction which is an in-plane direction of the semiconductor substrate, and along a second direction which is in the in-plane direction of the semiconductor substrate and is perpendicular to the first direction;
   a bridge portion connecting portions of opposed side surfaces of the two first films to each other, the bridge portion having a flat bottom surface; and
   a conductor provided under the bottom surface of the bridge portion,
   wherein the two first films are stacked films constructed by alternately stacking a conductive layer made of a same material as the conductor, and an insulating layer.

2. The semiconductor device according to claim 1, wherein the bottom surface of the bridge portion is located on the conductive layer as an uppermost layer.

3. The semiconductor device according to claim 1, wherein the conductive layer contains tungsten.

4. The semiconductor device according to claim 1, wherein the bridge portion is formed at a top surface portion of each of the at least two first films.

5. The semiconductor device according to claim 1, wherein the bridge portion is a silicon monoxide film.

6. The semiconductor device according to claim 1, wherein at least one of the two first films is a single-layer film.

7. The semiconductor device according to claim 1, wherein the conductive layer and the insulating layer are alternately stacked on the substrate.

8. The semiconductor device according to claim 1, wherein the conductor is disposed in a space between the at least two first films.

* * * * *